United States Patent [19]

Starr et al.

[11] Patent Number: 5,776,790
[45] Date of Patent: Jul. 7, 1998

[54] C4 PB/SN EVAPORATION PROCESS

[75] Inventors: Stephen George Starr; John Conrad Kutt, both of Essex Junction; Robert Henry Zalokar, Jr., Colchester, all of Vt.

[73] Assignee: International Business Machines Corporation, Armonk, N.Y.

[21] Appl. No.: 608,162

[22] Filed: Feb. 28, 1996

[51] Int. Cl.⁶ .................................................. H01L 21/285
[52] U.S. Cl. ........................... 438/6; 438/613; 438/679; 427/282
[58] Field of Search ........................... 438/5, 6, 612, 438/613, 679, 343, 406; 228/180.22; 29/874, 885; 257/737, 738; 427/99, 250, 282, 295, 591

[56] References Cited

U.S. PATENT DOCUMENTS

| | | |
|---|---|---|
| 2,759,861 | 8/1956 | Collins et al. |
| 3,647,533 | 3/1972 | Hicks |
| 4,066,819 | 1/1978 | Anderson et al. |
| 4,391,034 | 7/1983 | Stuby |
| 4,553,853 | 11/1985 | Gregory et al. .............. 374/25 |
| 5,104,695 | 4/1992 | Greer et al. .............. 438/679 |

OTHER PUBLICATIONS

E. J. Brainard et al., IBM Tech. Discl. Bulletin 25 (9)(1983)4756 "Ramping technique for Pb/Sn evaporation" Feb. 1983.

C. Carpenter et al., IBM Tech. Discl. Bulletin 24 (7A) (1981) 3393 "Two–Cycle Pb/Sn Solder Evaporation" Dec. 1981.

F. Hornbeck et al., IBM Tech. Discl. Bulletin 25 (9) (1983) 4512 "Measurment of Temperature in Vacuum Deposition Apparatus" Feb. 1983.

Miyamoto, et al., "Solder–Bump Process by Multi-Source", IBM Technical Disclosure Bulletin V36, N10, Oct. 1993, pp. 31–32.

Bauer, et al., "Lift–Off Device for Metal Masks", IBM Technical Disclosure Bulletin V33 N5, OCt. 1990, pp. 428–429.

Millham, et al., "Thick Film Rate Controller", IBM Technical Disclosure Bulletin V31 N2, Jul. 1988, pp. 398–399.

Primary Examiner—Charles L. Bowers, Jr.
Assistant Examiner—Leon Radomsky
Attorney, Agent, or Firm—Whitham, Curtis & Whitham; William D. Sabo

[57] ABSTRACT

A process of Pb/Sn evaporation eliminates haloes in the manufacture of solder bump interconnects. This robust process of forms solder bump interconnects and reduces critical molebdnum mask sensitivity. Vacuum evaporation through which Pb/Sn C4 pads are deposited is performed by maintaining parallel temperature gradients between the molybdenum mask and silicon wafer, thus resulting in elimination of connecting haloes and yield losses.

3 Claims, 4 Drawing Sheets

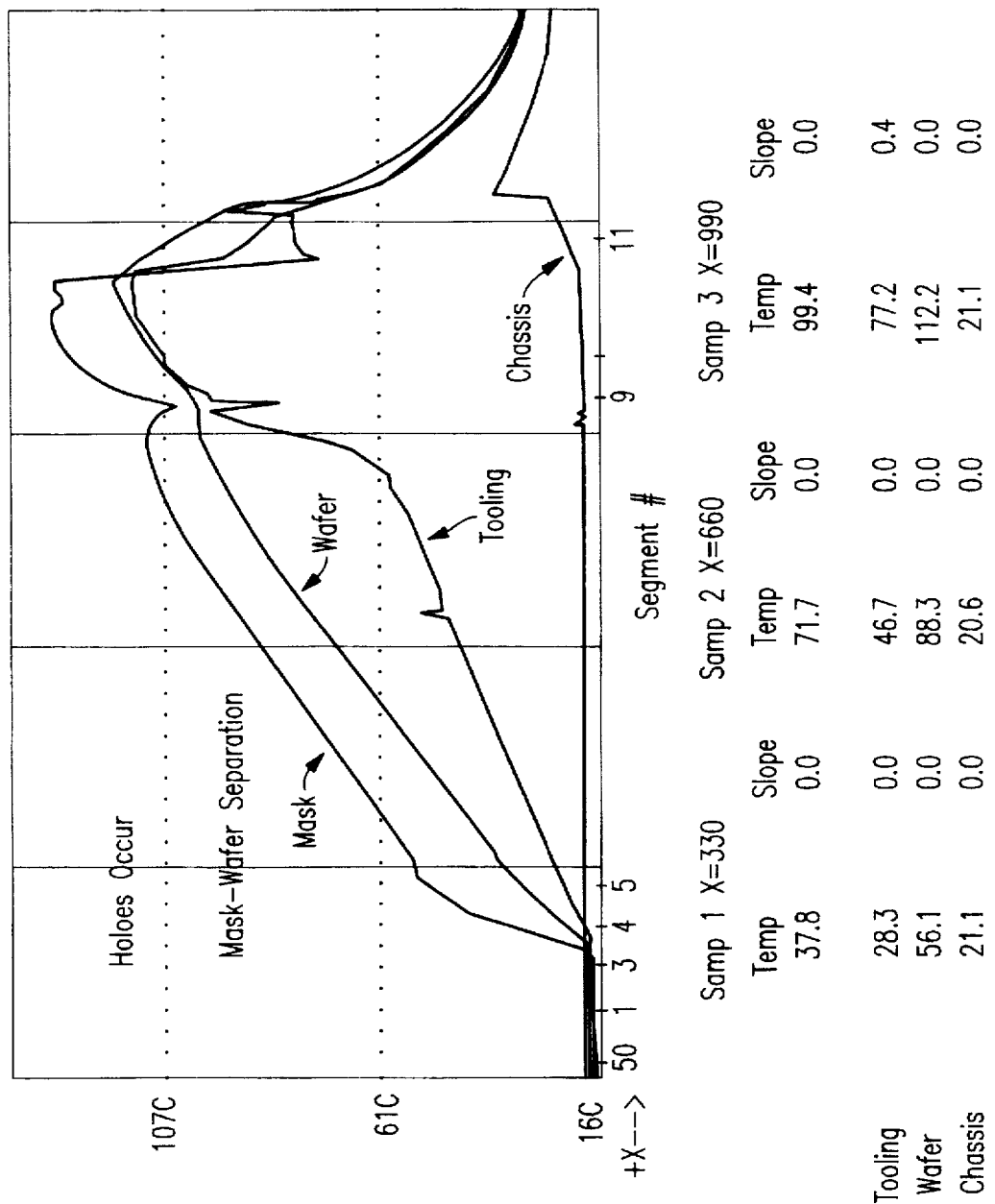

C4 PB/SN EVAPORATION PROCESS

BACKGROUND OF THE INVENTION

1. Field of the Invention

The present invention generally relates to interconnection systems for integrated circuits (ICs) of the type in which solder bumps are evaporated onto selected locations on a semiconductor wafer to form a so-called "flip-chip" and, more particularly, to a process for the deposition of a lead/tin (Pb/Sn) solder in which the temperatures of the wafer, mask and evaporation source are closely controlled and maintained in a specific range to improve yield.

2. Background Description

A now well-established technique for providing electrical interconnections between IC chips and a carrier is through the use of solder bumps formed on one surface of the chip at chip interconnect points. These solder bumps are formed in a pattern or array on the chip surface, and a corresponding pattern or array of pads is formed on a chip carrier. The chip is "flipped" to bring the solder bumps into mating contact with the pads on the chip carrier. The combination is subjected to a temperature of the melting temperature of the solder to cause the solder to flow and wet the pads so that, upon cooling, a mechanical bond is formed between the contact points on the chip and the chip carrier, insuring good electrical interconnection between the two.

The solder bumps are formed in a Controlled, Collapse Chip Connection (C4) structure developed by the International Business Machines (IBM) Corp. An example of this structure is shown in FIG. 1. Here, a layer 10 of insulator such as silicon dioxide ($SiO_2$) is deposited over a silicon substrate 1 in which electronic circuits have been formed. A contact pad 4 of, for example copper (Cu) is formed by Damascene process in the insulator layer 10. Although not shown, this contact pad is connected to a circuit terminal point in the silicon substrate. A layer 2 of silicon nitride ($Si_3N_4$) is formed over the insulator layer 10, and by known photoresist and etch techniques, a hole is formed in the layer 2 over the pad 4 and within which a C4 barrier metal such as aluminum (Al) is deposited. A final passivation layer 9 of, for example, $SiO_2$ or $Si_3N_4$ is formed over the layer 2 and C4 barrier 7, and again by known photoresist and etch techniques, a hole is formed in the passivation layer 9 over the C4 barrier 7. Within the hole formed in the passivation layer 9 and extending over the immediately adjacent periphery of the passivation layer is deposited Pad Limiting Metallurgy (PLM) 11 of chromium (Cr), copper (Cu) or silver (Ag). A lead/tin (Pb/Sn) solder bump 12 is then formed on the PLM 11.

As the densities of ICs increases, the densities of the solder bumps on a surface of the IC increases, requiring ever finer resolutions in the process of making the C4 structures. This, in turn, has resulted in increased chip yield losses which can be attributed to a number of causes. These include Pb/Sn "haloes" produced in the evaporation process, which can produce electrical short circuits between pads, non-uniform deposition of Pb/Sn, which can result in low volume pads that fail to make contact with the corresponding pads on the chip carrier, and "spits" during the Pb/Sn evaporation process, which can result in both short circuits and non-uniform deposition. In addition, the molybdenum shadow mask used in the deposition process becomes an increasingly critical element in the production of high yield chips. The molybdenum shadow mask for these high density patterns is thinner (0.003" and 0.004") and can more easily separate from the wafer due to uneven heating, resulting in the haloes mentioned above. Moreover, the thinner molybdenum shadow mask is more easily damaged by creasing and scratching due to such uneven heating making the mask (an expensive element) unusable for production.

SUMMARY OF THE INVENTION

It is therefore an object of the present invention to provide a process of Pb/Sn evaporation which eliminates haloes in the manufacture of solder bump interconnects.

It is another object of the invention to provide a robust process of forming solder bump interconnects which reduces mask sensitivity.

According to the invention, there is provided a method of vacuum evaporation through which Pb/Sn C4 pads can be deposited while maintaining parallel temperature gradients between the molybdenum mask and silicon wafer, thus resulting in elimination of connecting haloes and yield losses.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a graph showing the temperature profile of the prior art process.

DETAILED DESCRIPTION OF A PREFERRED EMBODIMENT OF THE INVENTION

Figure 1:
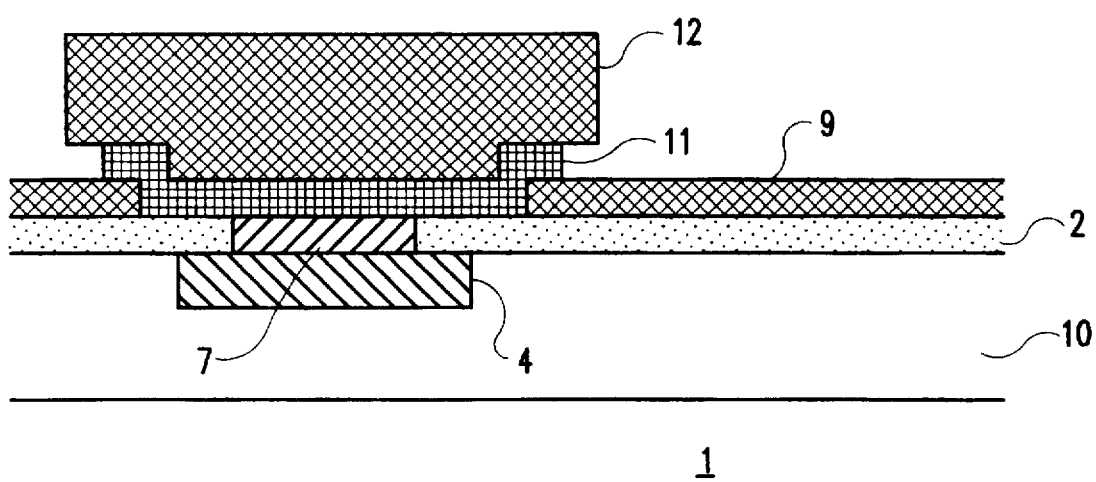
FIG. 1 is a cross-sectional view of a known C4 interconnect structure.
Figure 2A:
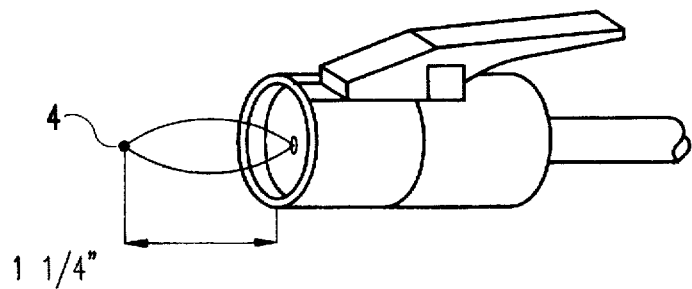
FIG. 2A is an enlarged portion of FIG. 2 showing in more detail the dimensions of the thermocouple.
Figure 2:
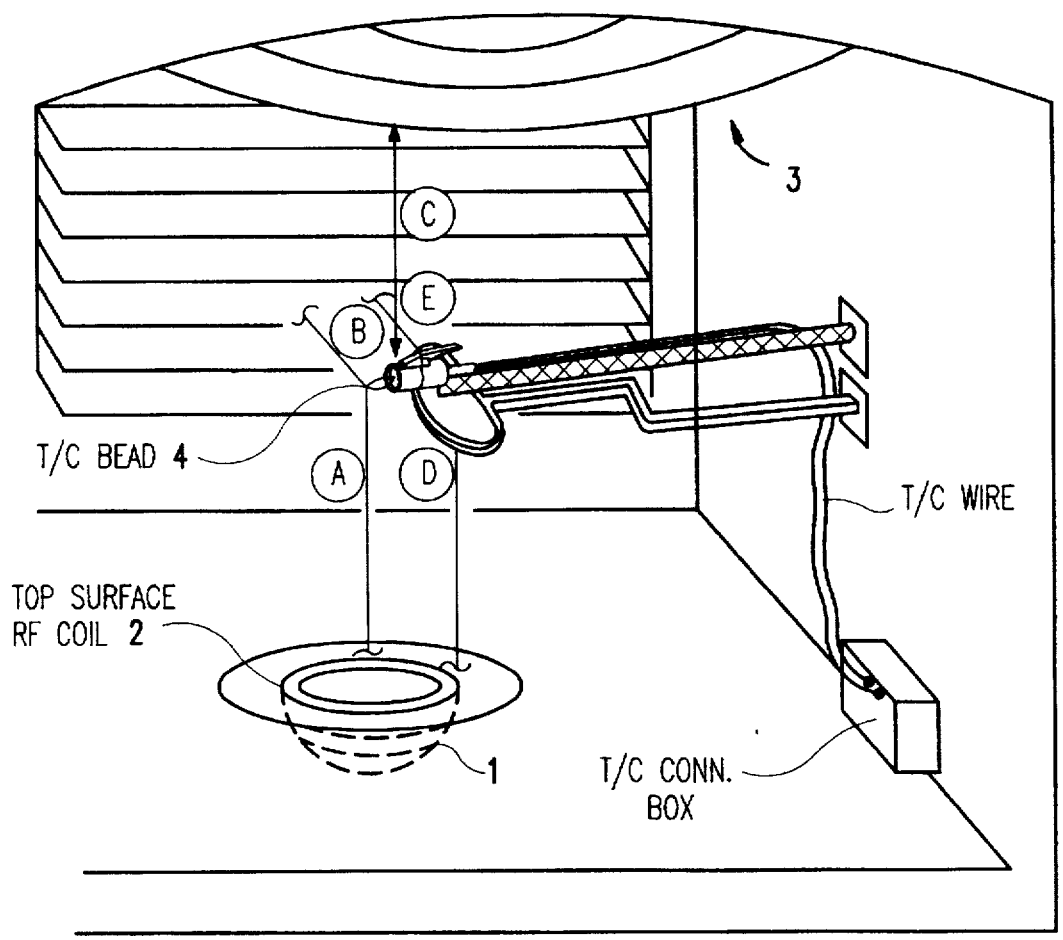
FIG. 2 is a pictorial illustration of the thermocouple positioning as practiced in a preferred embodiment of the invention.

Referring now to FIG. 2, the apparatus used in the practice of the invention includes a box coater such as a Balzers BAK760 vacuum evaporator with 10 kilowatt (KW) Lepel 450 kilohertz (KHz) radio frequency (RF) induction heating source and a water cooled heating coil, suitable shielding and wafer dome. The Pb/Sn (nominally 97/3) alloy pellets are evaporated from a tantalum (Ta) crucible 1 which is inductively heated by an RF coil 2. The atmospheric conditions during the process are typically $1 \times 10^{-7}$ Torr. There is typically sub parts per million (ppm) levels of $N_2$, $O_2$ and minute traces of inert gases. The deposition of lead and finally tin occurs by evaporation onto a rotated dome 3 of seven wafers (200 mM) that have been previously processed through molybdenum mask align, RF sputter clean and PLM evaporation.

The rate of deposition is indirectly controlled by sensing the evaporant (Pb or Sn) using a bare 30 gage type K thermocouple 4 (shown in more detail in FIG. 2A) which inputs it signal to a multi step PID based controller. The controller drives the power output from the Lepel RF induction heater. In the practice of the preferred embodiment of the invention, the dimensions shown in FIG. 2 are as follows:

Ⓐ Bead to coil 15¼" (no operator adjustment)

Ⓑ Bead to chevron 16" (no operator adjustment)

Ⓒ Holder face to side shield 18" (no operator adjustment)
Ⓓ Dist. shield to coil 13¾"
Ⓔ Dist. shield to chevron 10¼"

Precise thermocouple (TC) placement in the evaporant path is required for optimum performance, although the specific dimensions given are by way of example only and can be varied within the spirit of the invention.

Figure 3:
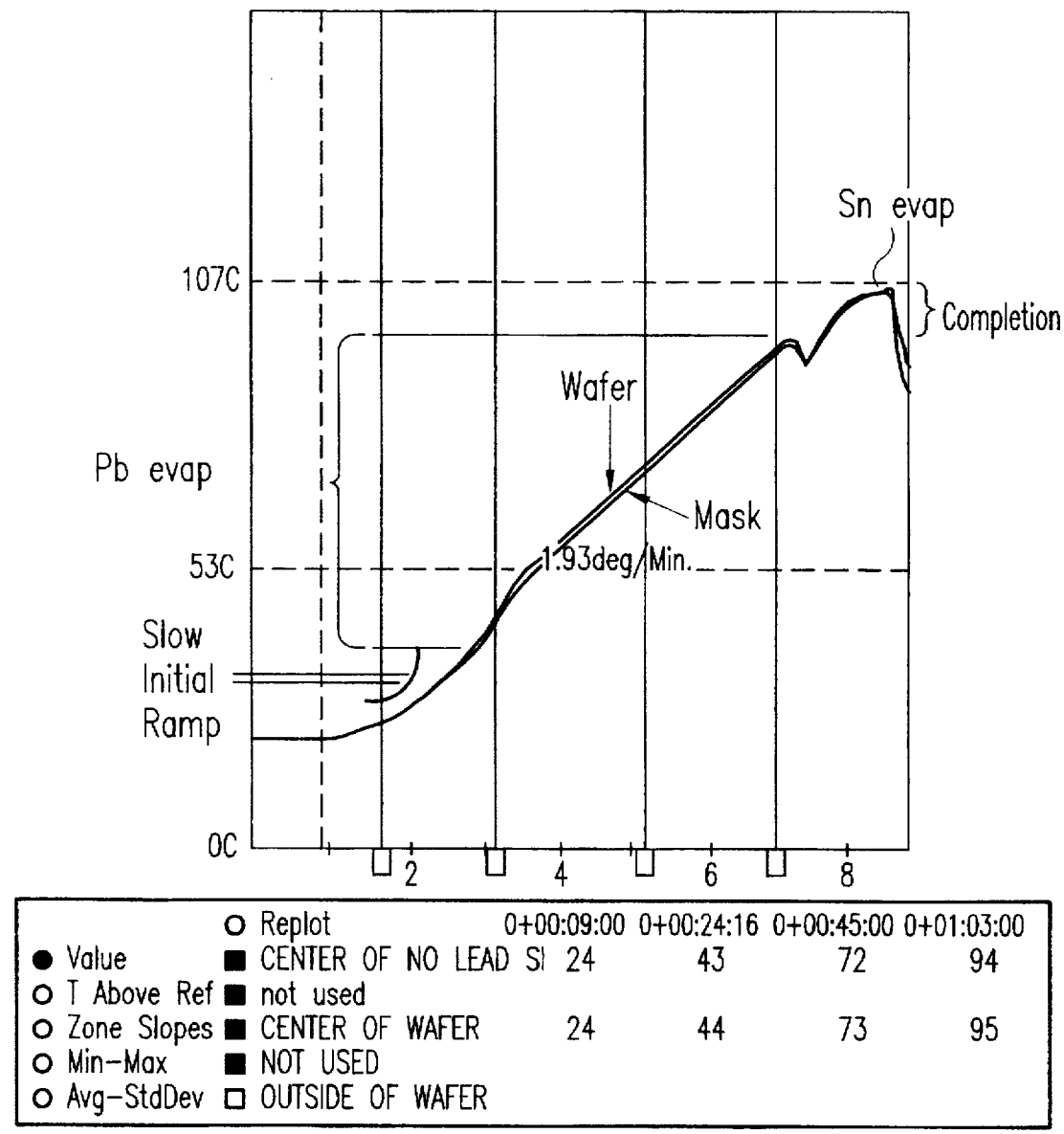
FIG. 3 is a graph showing the real time process temperature profile of a complete evaporation process according to the invention.

The keys to the approach are based upon the use of an in situ process temperature data acquisition device which can report on the temperature at the wafer surface, mask surface and the associated tooling. The real time process temperature profile of the optimum process is shown in FIG. 3 taken during a complete evaporation process. The temperature/time traces for the mask and wafer are parallel and nearly coincide.

If the initial program's heating rate in segments 50, 1, 2, 3, and 4 is too fast, evaporant reaches the mask at an extremely high flux and results in uneven heating of the mask and wafer as shown in FIG. 4. This rapid heating results in the molybdenum mask expanding more rapidly than the wafer and results in haloes due to lead evaporation through a molybdenum mask which has lifted from the wafer surface.

The program steps used to melt, begin evaporation and extend evaporation are shown in Table I (old process).

TABLE I

| Segment | Time | Total Time | Set Point | Actual |
|---|---|---|---|---|
| 50 | 2.0 Min | 2.0 Min | 50 | 38 |
| 1 | 2.0 Min | 4.0 Min | 70 | 40 |
| 2 | 3.0 Min | 7.0 Min | 90 | 64 |
| 3 | 3.0 Min | 10.0 Min | 110 | 79 |
| 4 | 3.0 Min | 13.0 Min | 140 | 118 |
| 5 | 3.0 Min | 16.0 Min | 170 | 149 |
| 6 | 43.0 Min | 59.0 Min | 170 | 168 |
| 7 | 10 Sec | 59.0 Min | 170 | 150' |
| 8 | 30 Sec | 59.0 Min | 170 | 131 |
| 9 | 4.0 Min | 63.0 Min | 170 | 210 |
| 10 | 7.0 Min | 70.0 Min | 235 | 212 |
| 11 | | 70.0 Min | | |

The program steps according to the process of the invention used to melt, begin evaporation and extend evaporation are shown in Table II.

TABLE II

| Segment | Time | Description | Set Point | Actual |
|---|---|---|---|---|
| 50 | 2.0 Min | PbSn phase change sol-liq | 50 | 39 |
| 1 | 2.0 Min | PbSn phase change sol-liq | 60 | 45 |
| 2 | 5.0 Min | Initial Pb evaporation | 70 | 64 |
| 3 | 5.0 Min | Initial Pb evaporation | 80 | 79 |
| 4* | 10.0 Min | Rate controlled evap. | 120 | 118 |
| 5* | 5.0 Min | Rate controlled evap. | 150 | 149 |
| 6 | 40.0 Min | Final Pb evaporation | 170 | 168 |
| 7 | 10 Sec | Pb evaporation end point | 170 | 150' |
| 8 | 30 Sec | Pre Sn power | 170 | 131 |
| 9 | 4.0 Min | Sn evaporation | 210 | 210 |
| 10 | 7.0 Min | Sn evaporation | 215 | 212 |
| 11 | | Vent | | |
| 49 | | Off | | |

*Segments 4 and 5 are rate controlled to minimize the wafer ΔT. Segments 6 and 7 are rate controlled to maximize cycle time efficiency.

The critical modification to the evaporation program involves the initial heating segments. It is mandatory to achieve heating of the tooled wafer assembly loaded on the dome at a rate of 1.5 to a maximum of 3° C./minute during a process run. This has been accomplished by empirical observations and repetitive profile process reruns to achieve the desired result.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A process of Pb/Sn evaporation to form solder bump interconnects and reduce critical molybdenum mask sensitivity comprising the steps of:

sensing in situ process temperature at a wafer surface and a mask surface; and in response to the sensed process temperature, maintaining parallel temperature gradients between the molybdenum mask and the wafer during vacuum evaporation through which Pb/Sn pads are deposited, thus resulting in elimination of connecting haloes and yield losses.

2. The process of Pb/Sn evaporation to form solder bump interconnects recited in claim 1 wherein the step of sensing is performed with a thermocouple located in a path of an evaporant.

3. A process of Pb/Sn evaporation to form solder bump interconnects and reduce critical molybdenum mask sensitivity comprising the steps of:

sensing in situ process temperature at a wafer surface and a mask surface; and in response to the sensed process temperature, maintaining parallel temperature gradients between the molybdenum mask and the wafer during vacuum evaporation through which Pb/Sn pads are deposited, thus resulting in elimination of connecting haloes and yield losses, wherein the step of sensing is performed with a thermocouple located in a path of an evaporant, and wherein the step of maintaining parallel temperature gradients between the molybdenum mask and the wafer during vacuum evaporation is performed according to the following profile:

| Segment | Time | Description | Set Point | Actual |
|---|---|---|---|---|
| 50 | 2.0 Min | PbSn phase change sol-liq | 50 | 39 |
| 1 | 2.0 Min | PbSn phase change sol-liq | 60 | 45 |
| 2 | 5.0 Min | Initial Pb evaporation | 70 | 64 |
| 3 | 5.0 Min | Initial Pb evaporation | 80 | 79 |
| 4 | 10.0 Min | Rate controlled evaporation | 120 | 118 |
| 5 | 5.0 Min | Rate controlled evaporation | 150 | 149 |
| 6 | 40.0 Min | Final Pb evaporation | 170 | 168 |
| 7 | 10 Sec | Pb evaporation end point | 170 | 150' |
| 8 | 30 Sec | Pre Sn power | 170 | 131 |
| 9 | 4.0 Min | Sn evaporation | 210 | 210 |
| 10 | 7.0 Min | Sn evaporation | 215 | 212 |
| 11 | | Vent | | |
| 49 | | Off | | | wherein segments 4 and 5 are rate controlled to minimize the wafer ΔT and segments 6 and 7 are rate controlled to maximize cycle time efficiency.

* * * * *